United States Patent
Lee et al.

(10) Patent No.: US 8,987,061 B2
(45) Date of Patent: Mar. 24, 2015

(54) METHODS FOR ANTENNA SWITCH MODULES

(71) Applicant: Skyworks Solutions, Inc., Woburn, MA (US)

(72) Inventors: Jong-Hoon Lee, San Diego, CA (US); Chuming Shih, Chandler, AZ (US)

(73) Assignee: Skyworks Soultions, Inc., Woburn, MA (US)

( * ) Notice: Subject to any disclaimer, the term of this patent is extended or adjusted under 35 U.S.C. 154(b) by 0 days.

(21) Appl. No.: 14/309,670

(22) Filed: Jun. 19, 2014

(65) Prior Publication Data

US 2014/0300525 A1    Oct. 9, 2014

Related U.S. Application Data

(62) Division of application No. 13/570,077, filed on Aug. 8, 2012, now Pat. No. 8,786,079.

(60) Provisional application No. 61/522,065, filed on Aug. 10, 2011.

(51) Int. Cl.
| | | |
|---|---|---|
| H01L 21/00 | (2006.01) | |
| H01L 23/34 | (2006.01) | |
| H01Q 1/50 | (2006.01) | |
| H01L 23/66 | (2006.01) | |
| H01L 23/64 | (2006.01) | |
| H01L 25/16 | (2006.01) | |
| H01L 21/84 | (2006.01) | |
| H01L 23/498 | (2006.01) | |
| H01L 27/13 | (2006.01) | |
| H01L 49/02 | (2006.01) | |
| H01P 11/00 | (2006.01) | |

(52) U.S. Cl.
CPC .................. *H01Q 1/50* (2013.01); *H01L 23/66* (2013.01); *H01L 23/642* (2013.01); *H01L 23/645* (2013.01); *H01L 25/16* (2013.01); *H01L 21/84* (2013.01); *H01L 23/49822* (2013.01); *H01L 23/49838* (2013.01); *H01L 27/13* (2013.01); *H01L 28/10* (2013.01); *H01L 28/40* (2013.01); *H01P 11/001* (2013.01); *H01L 2224/48227* (2013.01); *H01L 2224/48237* (2013.01); *H01L 2224/49171* (2013.01); *H01L 2924/30107* (2013.01)
USPC .................... 438/121; 257/728; 257/E21.705

(58) Field of Classification Search
USPC .................. 438/121; 257/664, 728, E21.705
See application file for complete search history.

(56) References Cited

U.S. PATENT DOCUMENTS

| | | | |
|---|---|---|---|
| 8,786,079 B2 | 7/2014 | Lee et al. | |
| 2006/0223577 A1* | 10/2006 | Ouzillou | .................... 455/553.1 |
| 2008/0315356 A1* | 12/2008 | Reisner | ......................... 257/531 |
| 2012/0147578 A1* | 6/2012 | Jin et al. | ........................ 361/774 |
| 2012/0319302 A1* | 12/2012 | Lee et al. | ....................... 257/787 |

* cited by examiner

*Primary Examiner* — Daniel Whalen

(74) *Attorney, Agent, or Firm* — Knobbe, Martens, Olson & Bear, LLP

(57) ABSTRACT

Methods for antenna switch modules are disclosed. In certain implementations, a method of making an antenna switch module is provided. The method includes providing a package substrate implemented to receive one or more electrical components, attaching a silicon on insulator (SOI) die to the package substrate, and providing an integrated filter. The SOI die includes a capacitor and a switch coupled to a plurality of radio frequency (RF) signal paths. The integrated filter filters an RF signal received on a first RF signal path of the plurality of RF signal paths, and includes the capacitor of the SOI die and an inductor.

20 Claims, 9 Drawing Sheets

METHODS FOR ANTENNA SWITCH MODULES

CROSS-REFERENCE TO RELATED APPLICATIONS

This application is a divisional of U.S. patent application Ser. No. 13/570,077, filed Aug. 8, 2012 and titled "ANTENNA SWITCH MODULES AND METHODS OF MAKING THE SAME", which claims the benefit of priority under 35 U.S.C. §119(e) of U.S. Provisional Patent Application No. 61/522,065, filed Aug. 10, 2011 and titled "ANTENNA SWITCH MODULES AND METHODS OF MAKING THE SAME", each of which are herein incorporated by reference in their entireties.

BACKGROUND

1. Field

Embodiments of the invention relate to electronic systems, and in particular, to radio frequency (RF) electronics.

2. Description of the Related Technology

An RF system can include an antenna for receiving and/or transmitting RF signals. However, there can be several components in an RF system that may need to access to the antenna. For example, an RF system can include different transmit or receive paths associated with different frequency bands, different communication standards and/or different power modes, and each path may need access to the antenna at certain instances of time.

An antenna switch module can be used to electrically connect an antenna to a particular transmit or receive path of the RF system, thereby allowing multiple components to access the antenna. The performance of the antenna switch module can be important, since the antenna switch module can introduce noise and/or insertion loss. Furthermore, the antenna switch module can impact the area of the RF system, thereby affecting a form factor of a wireless device using the antenna switch module.

There is a need for an antenna switch module having a relatively small area. Furthermore, there is a need for an antenna switch module that has a relatively low insertion loss, improved harmonic performance, and a relatively high degree of isolation.

SUMMARY

In certain embodiments, the present disclosure relates to an antenna switch module including a package substrate implemented to receive one or more electrical components, a silicon on insulator (SOI) die, and a first integrated filter. The SOI die includes a first capacitor and a switch configured to be coupled to a plurality of radio frequency (RF) signal paths. The SOI die is attached to the package substrate. The first integrated filter is configured to filter an RF signal received on a first RF signal path of the plurality of RF signal paths, and the first integrated filter includes the first capacitor of the SOI die and a first inductor.

In several embodiments, the package substrate includes a plurality of conductive layers and a plurality of non conductive layers. According to certain embodiments, the first inductor is formed at least partly from a first conductive layer of the plurality of conductive layers, the first conductive layer disposed beneath a layer of the package substrate used to attach the SOI die. In a number of embodiments, the first inductor is a spiral inductor formed from trace of the first conductive layer. According to some embodiments, the first inductor is formed from trace of more than one of the plurality of conductive layers.

In several embodiments, the first inductor has an inductance ranging between about 2.5 nH and about 7 nH. According to some embodiments, the first capacitor has a capacitance ranging between about 0.8 pF and about 2.7 pF.

In certain embodiments, the first inductor is a surface mount component attached to the package substrate adjacent the SOI die.

In a number of embodiments, the antenna switch module further includes a second integrated filter configured to filter a RF signal received on a second RF signal path of the plurality of RF signal paths. The second integrated filter including a second capacitor of the SOI die and a second inductor. In certain embodiments, the package substrate includes a plurality of conductive layers and a plurality of non conductive layers, and the first and second inductors are formed at least partly from a first conductive layer of the plurality of conductive layers, the first conductive layer disposed beneath a layer of the package substrate used to attach the SOI die. In a number of embodiments, the first and second inductors are separated by a column of vias in the package substrate. In some other embodiments, the first inductor includes a surface mount inductor attached to the package substrate adjacent the SOI die and the second inductor is formed at least partly from a first conductive layer of a plurality of conductive layers of the package substrate, the first conductive layer disposed beneath a layer of the package substrate used to attach the SOI die. In certain other embodiments, the first and second inductors include first and second surface mount inductors, respectively, the first and second surface mount inductors attached to the package substrate.

In various embodiments, the SOI die is electrically connected to the package substrate using bond wires.

In accordance with a number of embodiments, the SOI die is a flip-chip die that is electrically connected to the package substrate using solder bumps.

In several embodiments, the first inductor and first capacitor are electrically connected in series.

In some embodiments, the switch is a single pole multi-throw switch.

In certain embodiments, the present disclosure relates to a package substrate implemented to receive one or more electrical components, a SOI die including a capacitor and a switch configured to be coupled to a plurality of radio frequency (RF) signal paths, and a means for filtering an RF signal received on a first RF signal path of the plurality of RF signal paths. The SOI die is attached to the package substrate. The filtering means includes the capacitor of the SOI die and an inductor associated with the package substrate.

In several embodiments, the package substrate includes a plurality of conductive layers and a plurality of non conductive layers. In a number of embodiments, the inductor is formed at least partly from a first conductive layer of the plurality of conductive layers, the first conductive layer disposed beneath a layer of the package substrate used to attach the SOI die.

In some embodiments, the inductor is a surface mount component attached to the package substrate adjacent the SOI die.

In certain embodiments, the present disclosure relates to a method of making an antenna switch module. The method includes providing a package substrate implemented to receive one or more electrical components, attaching a SOI die to the package substrate, and providing an integrated filter. The SOI die includes a capacitor and a switch configured to be coupled to a plurality of radio frequency (RF) signal paths. The integrated filter is configured to filter an RF signal received on a first RF signal path of the plurality of RF signal paths. The integrated filter includes the capacitor of the SOI die and an inductor.

In a number of embodiments, the method further includes forming the inductor at least partly from a first conductive layer of a plurality of conductive layers of the package substrate, the first conductive layer disposed beneath a layer of the package substrate used to attach the SOI die.

In various embodiments, the inductor is a surface mount component, and the method further includes attaching the inductor to the package substrate adjacent the SOI die.

In certain embodiments, the present disclosure relates to a wireless device including an antenna switch module. The antenna switch module includes a package substrate, a SOI die, and an integrated filter. The SOI die includes a capacitor and a switch electrically connected to a plurality of radio frequency (RF) signal paths. The SOI die is attached to the package substrate. The integrated filter includes the capacitor of the SOI die and an inductor. The integrated filter is configured to filter an RF signal received on a first RF signal path of the plurality of RF signal paths.

In some embodiments, the package substrate includes a plurality of conductive layers and a plurality of non conductive layers. In a number of embodiments, the inductor is formed at least partly from a first conductive layer of the plurality of conductive layers, the first conductive layer disposed beneath a layer of the package substrate used to attach the SOI die.

In various embodiments, the inductor is a surface mount component attached to the package substrate adjacent the SOI die.

According to some embodiments, the wireless device further includes an antenna electrically connected to the antenna switch module.

In certain embodiments, the wireless device further includes a transceiver electrically connected to the antenna switch module.

In several embodiments, the wireless device further includes a Wi-Fi module electrically connected to the antenna switch module.

In various embodiments, the wireless device further includes a mobile television module electrically connected to the antenna switch module.

In some embodiments, the wireless device further includes a front end module electrically connected to the antenna switch module.

In certain embodiments, the wireless device further includes a power amplifier module electrically connected to the antenna switch module.

DETAILED DESCRIPTION OF EMBODIMENTS

The headings provided herein, if any, are for convenience only and do not necessarily affect the scope or meaning of the claimed invention.

Antenna switch modules and methods of making the same are disclosed herein. In certain implementations, an antenna switch module is provided for selecting a particular RF transmit or receive path. The antenna switch module includes a package substrate, an integrated filter, and a silicon on insulator (SOI) die attached to the package substrate. The SOI die includes a capacitor configured to operate in the integrated filter and a multi-throw switch for selecting amongst the RF signal paths. In some implementations, a surface mount inductor is attached to the package substrate adjacent the SOI die and is configured to operate in the integrated filter with the capacitor. In certain implementations, the inductor is formed from a conductive layer of the package substrate disposed beneath a layer of the package substrate used to attach the SOI die. By providing the antenna switch module with an integrated filter that includes the capacitor of the SOI die, the area of the antenna switch module can be reduced relative to a scheme in which the capacitor is formed in other ways, such as using surface mount components. Additionally, the antenna switch modules described herein can have low insertion loss and/or high isolation. In some implementations, the antenna switch module includes a plurality of integrated filters and the SOI die includes a plurality of capacitors configured to operate in the integrated filters.

Figure 1:
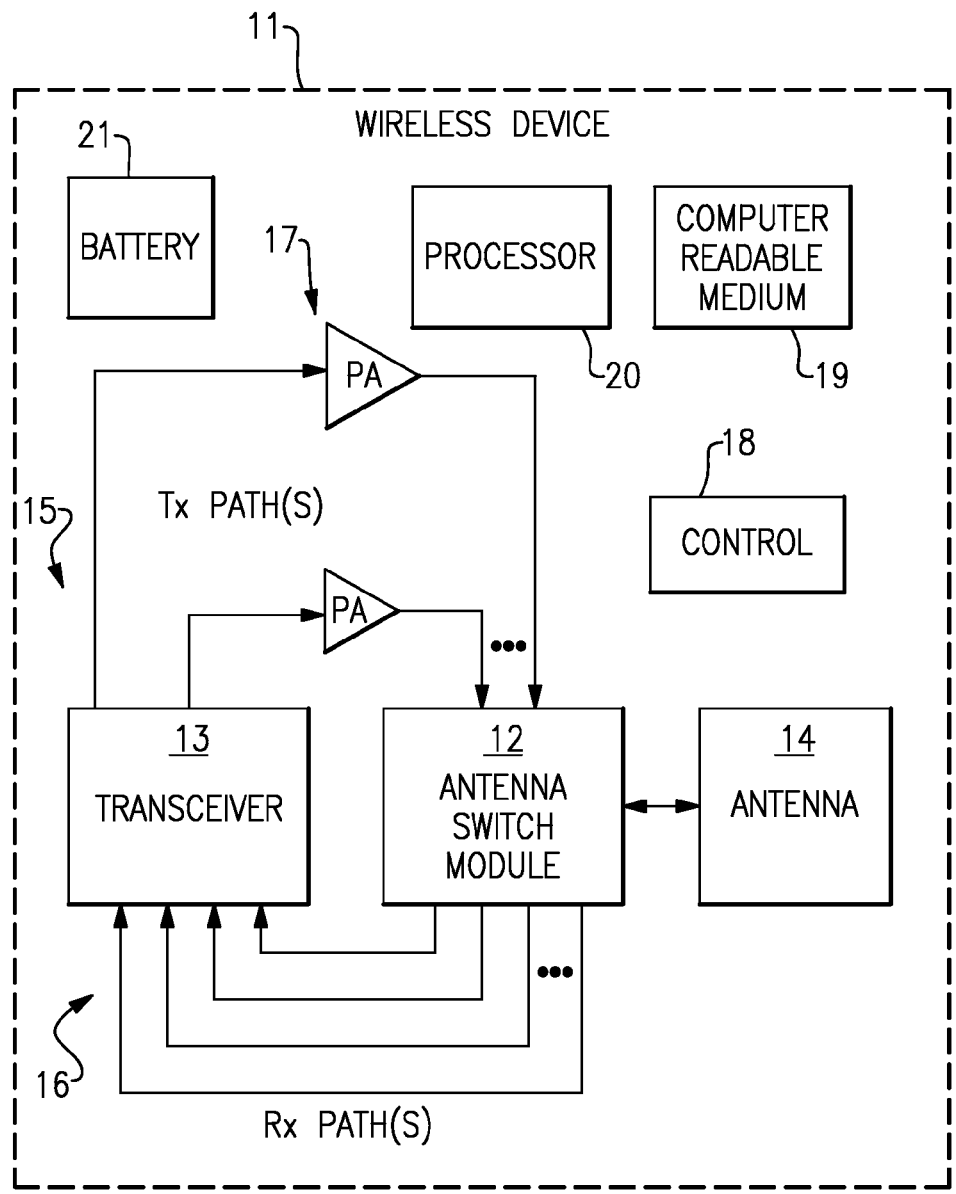
FIG. 1 is a schematic block diagram of one example of a wireless device that can include one or more antenna switch modules.

Overview of Examples of Wireless Devices that can Include Antenna Switch Modules FIG. 1 is a schematic block diagram of one example of a wireless or mobile device 11 that can include one or more antenna switch modules. The wireless device 11 can include antenna switch modules implementing one or more features of the present disclosure.

The example wireless device 11 depicted in FIG. 1 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

Antenna switch modules of the present disclosure can be used within a mobile device implementing the foregoing example modes and/or bands, and in other communication standards. For example, 3G, 4G, LTE, and Advanced LTE are non-limiting examples of such standards.

In certain embodiments, the wireless device 11 can include an antenna switch module 12, a transceiver 13, an antenna 14, power amplifiers 17, a control component 18, a computer readable medium 19, a processor 20, and a battery 21.

The transceiver 13 can generate RF signals for transmission via the antenna 14. Furthermore, the transceiver 13 can receive incoming RF signals from the antenna 14. It will be understood that various functionalities associated with transmitting and receiving of RF signals can be achieved by one or more components that are collectively represented in FIG. 1 as the transceiver 13. For example, a single component can be configured to provide both transmitting and receiving functionalities. In another example, transmitting and receiving functionalities can be provided by separate components.

In FIG. 1, one or more output signals from the transceiver 13 are depicted as being provided to the antenna 14 via one or more transmission paths 15. In the example shown, different transmission paths 15 can represent output paths associated with different bands and/or different power outputs. For instance, the two different paths shown can represent paths associated with different power outputs (e.g., low power output and high power output), and/or paths associated with different bands. The transmit paths 15 can include one or more power amplifiers 17 to aid in boosting a RF signal having a relatively low power to a higher power suitable for transmission. Although FIG. 1 illustrates a configuration using two transmission paths 15, the wireless device 11 can be adapted to include more or fewer transmission paths 15.

In FIG. 1, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 1 illustrates a configuration using four receiving paths 16, the wireless device 11 can be adapted to include more or fewer receiving paths 16.

To facilitate switching between receive and/or transmit paths, the antenna switch module 12 can be included and can be used electrically connect the antenna 14 to a selected transmit or receive path. Thus, the antenna switch module 12 can provide a number of switching functionalities associated with an operation of the wireless device 11. The antenna switch module 12 can include a multi-throw switch configured to provide functionalities associated with, for example, switching between different bands, switching between different power modes, switching between transmission and receiving modes, or some combination thereof. The antenna switch module 12 can also be configured to provide additional functionality, including filtering and/or duplexing of signals.

FIG. 1 illustrates that in certain embodiments, the control component 18 can be provided for controlling various control functionalities associated with operations of the antenna switch module 12 and/or other operating component(s). For example, the control component 18 can aid in providing control signals to the antenna switch module 12 so as to select a particular transmit or receive path. Non-limiting examples of the control component 18 are described herein in greater detail.

In certain embodiments, the processor 20 can be configured to facilitate implementation of various processes on the wireless device 11. The processor 20 can be a general purpose computer, special purpose computer, or other programmable data processing apparatus. In certain implementations, the wireless device 11 can include a computer-readable memory 19, which can include computer program instructions that may be provided to and executed by the processor 20.

The battery 21 can be any suitable battery for use in the wireless device 11, including, for example, a lithium-ion battery.

Figure 2:
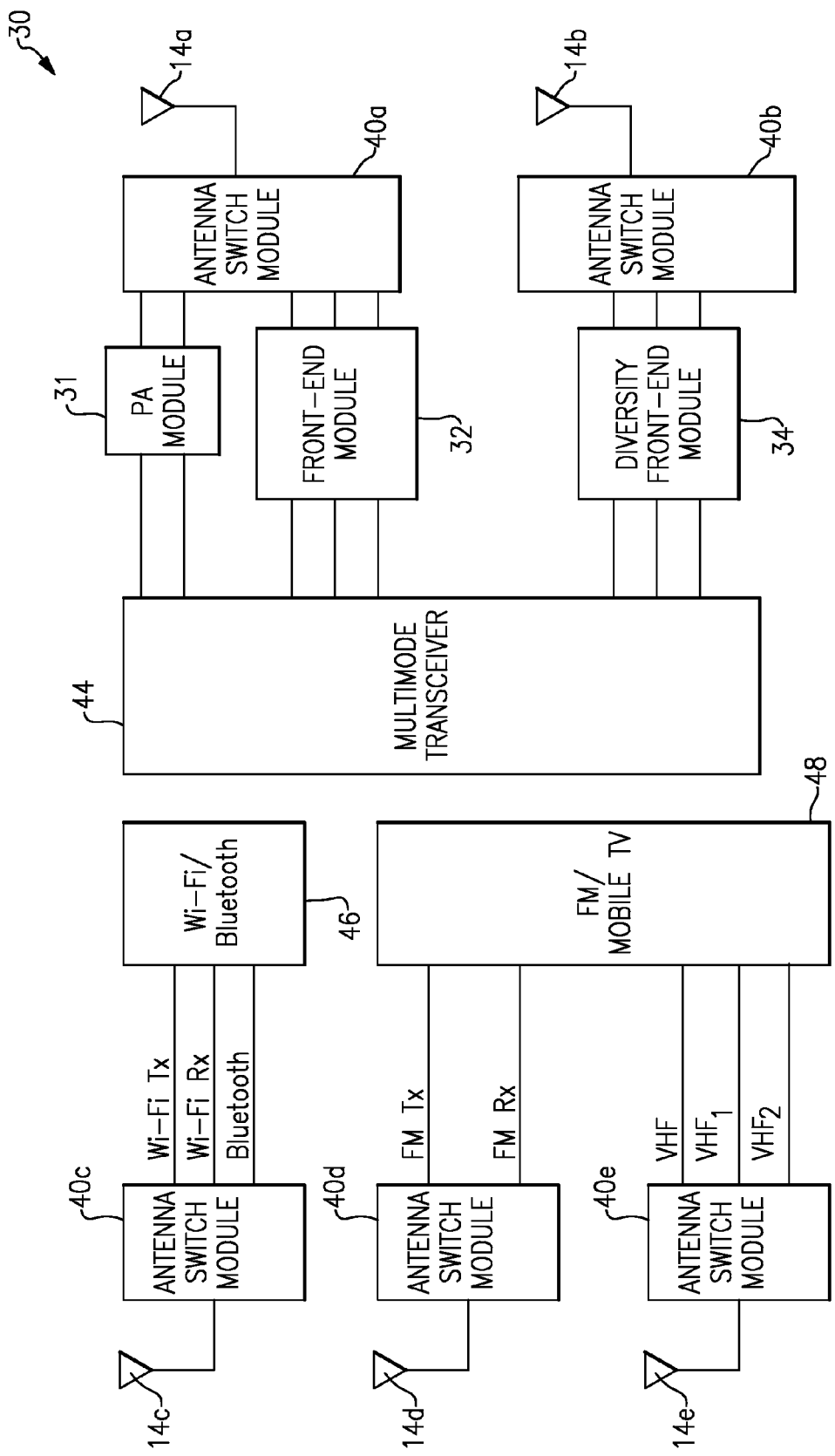
FIG. 2 is a schematic block diagram of another example of a wireless device that can include one or more antenna switch modules.

FIG. 2 is a schematic block diagram of another example of a wireless device 30 that can include one or more antenna switch modules. The illustrated wireless device 30 includes first to fifth antennas 14a-14e, a power amplifier module 31, a front-end module 32, a diversity front-end module 34, first to fifth antenna switch modules 40a-40e, a multimode transceiver 44, a Wi-Fi/Bluetooth module 46, and a FM/Mobile TV module 48.

The multimode transceiver 44 is electrically coupled to the power amplifier module 31, to the front-end module 32, and to the diversity front-end module 34. The multimode transceiver 44 can be used to generate and process RF signals using a variety of communication standards, including, for example, Global System for Mobile Communications (GSM), Code Division Multiple Access (CDMA), wideband CDMA (W-CDMA), Enhanced Data Rates for GSM Evolution (EDGE), and/or other proprietary and non-proprietary communications standards.

The power amplifier module 31 can include one or more power amplifiers, which be used to boost the power of RF signals having a relatively low power. Thereafter, the boosted RF signals can be used to drive the first antenna 14a. The power amplifier module 31 can include power amplifiers associated with different power outputs (e.g., low power output and high power output) and/or amplifications associated with different bands.

The front-end module 32 can include circuitry that can aid the multimode transceiver 44 in transmitting and receiving RF signals. For example, the front-end module 32 can include one or more low noise amplifiers (LNAs) for amplifying signals received using the first antenna 14a. The front-end module 32 can additionally and/or alternatively include filter circuitry, input and output matching circuitry and/or power detection circuitry. In certain implementations, the front-end module 32 can also include one or more power amplifiers.

The first antenna switch module 40a is electrically coupled to the first antenna 14a, to the power amplifier module 31, and to the front-end module 32. The first antenna switch module 40a can be used to electrically connect the first antenna 14a to a desired transmit or receive path. In certain embodiments described herein, the antenna switch module 40a can have a relatively small area, thereby improving the form factor of a mobile device used to communicate over a cellular or other network. The antenna switch module 40a can also have a low insertion loss and high band-to-band isolation, which can improve the quality of signals transmitted or received. For example, the antenna switch module can improve the quality of voice or data transmissions made using the first antenna 14a and/or improve reception quality for a given amount of power consumption.

In certain implementations, the diversity front-end module 34, the second antenna switch module 40b, and the second or diversity antenna 14b can also be included. Using a diversity front-end module 34 and the second antenna 14b can help improve the quality and/or reliability of a wireless link by reducing line-of-sight losses and/or mitigating the impacts of phase shifts, time delays and/or distortions associated with signal interference of the first antenna 14a. In some implementations, a plurality of diversity front-end modules, diversity antennas, and antenna switch modules can be provided to further improve diversity.

As illustrated in FIG. 2, the second antenna switch module 40b has been used to select amongst a multitude of RF signal paths associated with the diversity antenna 14b. In certain embodiments described herein, the second antenna switch module 14b can have a small area and a relatively low insertion loss and noise. Accordingly, the second antenna switch module 14b can help improve signal quality in the diversity signal path for a given power level, thereby reducing the probability of a call drop-out or a lost connection. Furthermore, by providing an antenna switch module with a smaller area, the form factor of the wireless device 30 can be reduced.

The wireless device 30 includes the Wi-Fi/Bluetooth module 46, which can be used to generate and process received Wi-Fi and/or Bluetooth signals. For example, the Wi-Fi/Bluetooth module 46 can be used to connect to a Bluetooth device, such as a wireless headset, and/or to communicate over the Internet using a wireless access point or hotspot. To aid in selecting a desired Wi-Fi or Bluetooth signal path, the third antenna switch module 14c has been included. In certain embodiments described herein, the antenna switch module 40c can have a relatively small area, thereby improving the form factor of a mobile device used to communicate over the Internet and/or with a Bluetooth accessory. The antenna switch module 40c can also have a low insertion loss and a high isolation, which can impact the quality of voice transmissions made or received using a Bluetooth device and/or improve the quality of a Wi-Fi Internet connection. For example, the antenna switch module 40c can improve connection strength and/or access range of the wireless device 30 to a wireless access point for a given amount of power consumption.

The FM/Mobile TV module 48 can be included in the wireless device 30, and can be used to receive and/or transmit radio or television signals, such as FM signals and/or VHF signals. The FM/Mobile TV module 48 can communicate with the fourth and fifth antennas 14d, 14e using the fourth and fifth antenna switch modules 40d, 40e, respectively. In certain embodiments described herein, the antenna switch modules 40d, 40e can have a relatively small area, thereby improving the form factor of a mobile device having mobile TV or FM radio capabilities. Additionally, the antenna switch modules 40d, 40e can also have a low insertion loss and high isolation, which can lead to improved streaming of multimedia content for a given amount of power consumption.

Although antenna switch modules have been illustrated and described above in the context of two examples of wireless devices, the antenna switch modules described herein can be used in other wireless devices and electronics.

Overview of Antenna Switch Modules

Figure 3:
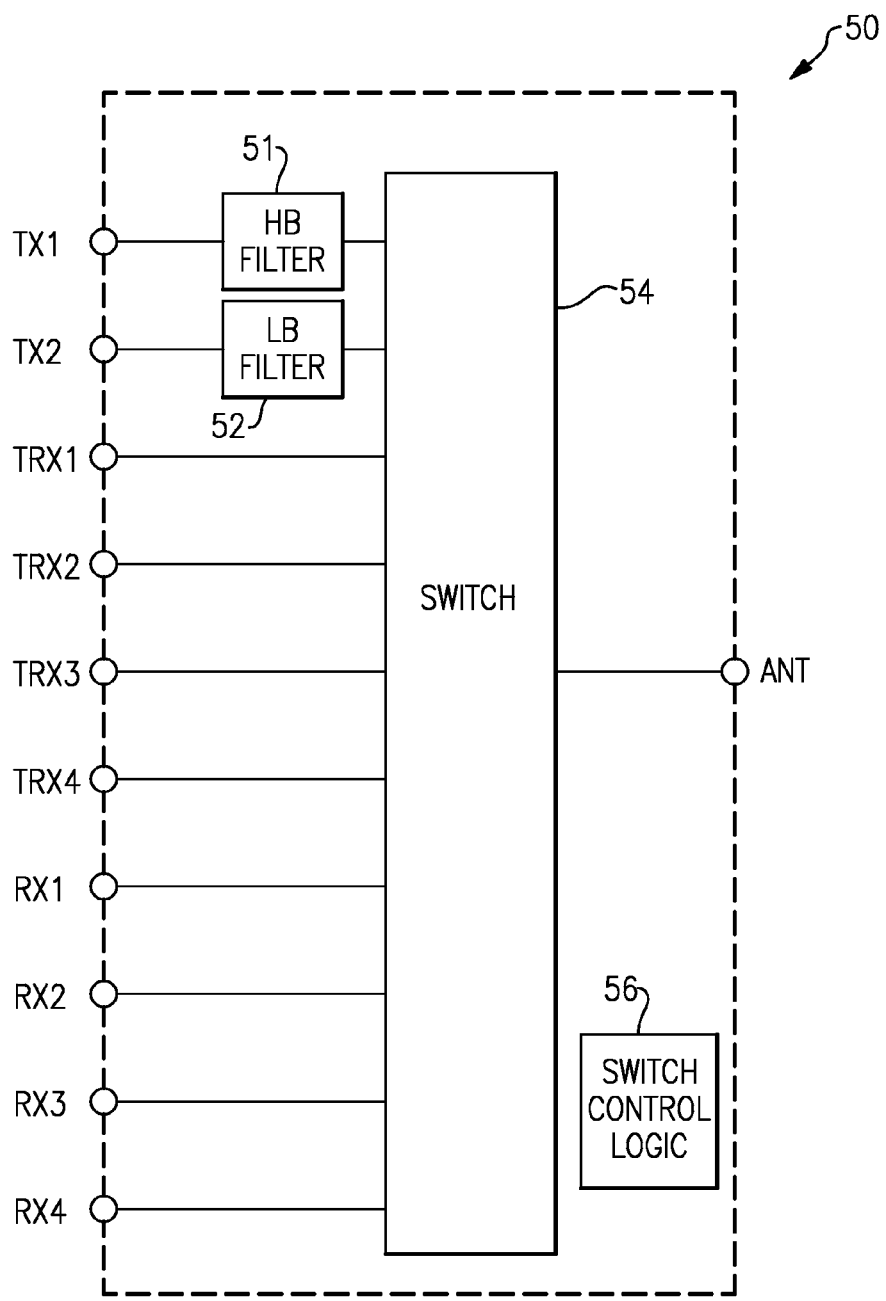
FIG. 3 is a schematic block diagram of one example of an antenna switch module.

FIG. 3 is a schematic block diagram of one example of an antenna switch module 50. The antenna switch module 50 includes a high band filter 51, a low band filter 52, a switch 54, and switch control logic 56.

The high band filter 51 is electrically connected to a first signal port TX1 of the antenna switch module 50 and to the switch 54. The low band filter 52 is electrically connected to a second signal port TX2 of the antenna switch module 50 and to the switch 54. The switch 54 is also electrically connected to an antenna port ANT of the antenna switch module 50 and to a third signal port TRX1, a fourth signal port TRX2, a fifth signal port TRX3, a sixth signal port TRX4, a seventh signal port RX1, an eighth signal port RX2, a ninth signal port RX3, and a tenth signal port RX4 of the antenna switch module 50. Although the antenna switch module 50 is illustrated as including ten signal ports and one antenna port, in certain implementations the antenna switch module can include more or fewer signal ports and/or additional antenna ports.

The switch 54 can be used to electrically connect a particular RF signal path to an antenna. For example, an antenna can be electrically coupled to the antenna port ANT, and RF signal paths or components can be electrically connected to the signal ports of the antenna switch module 50. The switch control logic 56 can be configured to control the switch 54 such that a signal port associated with a selected RF signal path is electrically connected to the antenna port ANT. In certain implementations, the switch 54 is a multi-throw switch. However, the switch 54 can be implemented in any suitable manner, and in some implementations can include a plurality of switch components configured to collective operate as a multi-throw switch. Although not illustrated, the switch control logic 56 can include inputs and/or outputs to aid the switch control logic 56 in communicating with other circuitry, including, for example, circuitry external to the antenna switch module 50.

As described earlier, electrically coupling multiple RF signal paths to an antenna using the antenna switch module 50 can help an electronic device communicate over a variety of networks, use different power modes, and/or communicate using different communication standards. For example, the illustrated configuration can be used to support quad-band GSM/EDGE and/or multi-band configurations of W-CDMA or LTE. However, persons having ordinary skill in the art will appreciate that the switch control module 50 can be configured in other ways.

One or more of the terminals or ports of the antenna switch module 50 can be electrically coupled to a filter to aid in filtering unwanted harmonics and/or noise from an RF signal. For example, the first and second signal ports TX1, TX2 have been electrically coupled to the high band and low band filters 51, 52, respectively. In certain implementations, the high band filter 51 is a low-pass filter configured to filter a GSM or CDMA signal in the 1800 MHz and/or 1900 MHz bands and the low band filter 52 is a low-pass filter configured to filter a GSM or CDMA signal in the 800 MHz and/or 900 MHz bands. However, the high band and low band filters 51, 52 can be implemented in other ways, and can be configured to, for example, filter signals of different standards and/or frequencies. Additionally, although only two of the signal ports of the antenna switch module 50 are illustrated as including filters, more or fewer signal ports of the antenna switch module 50 can include filters.

Figure 4A:
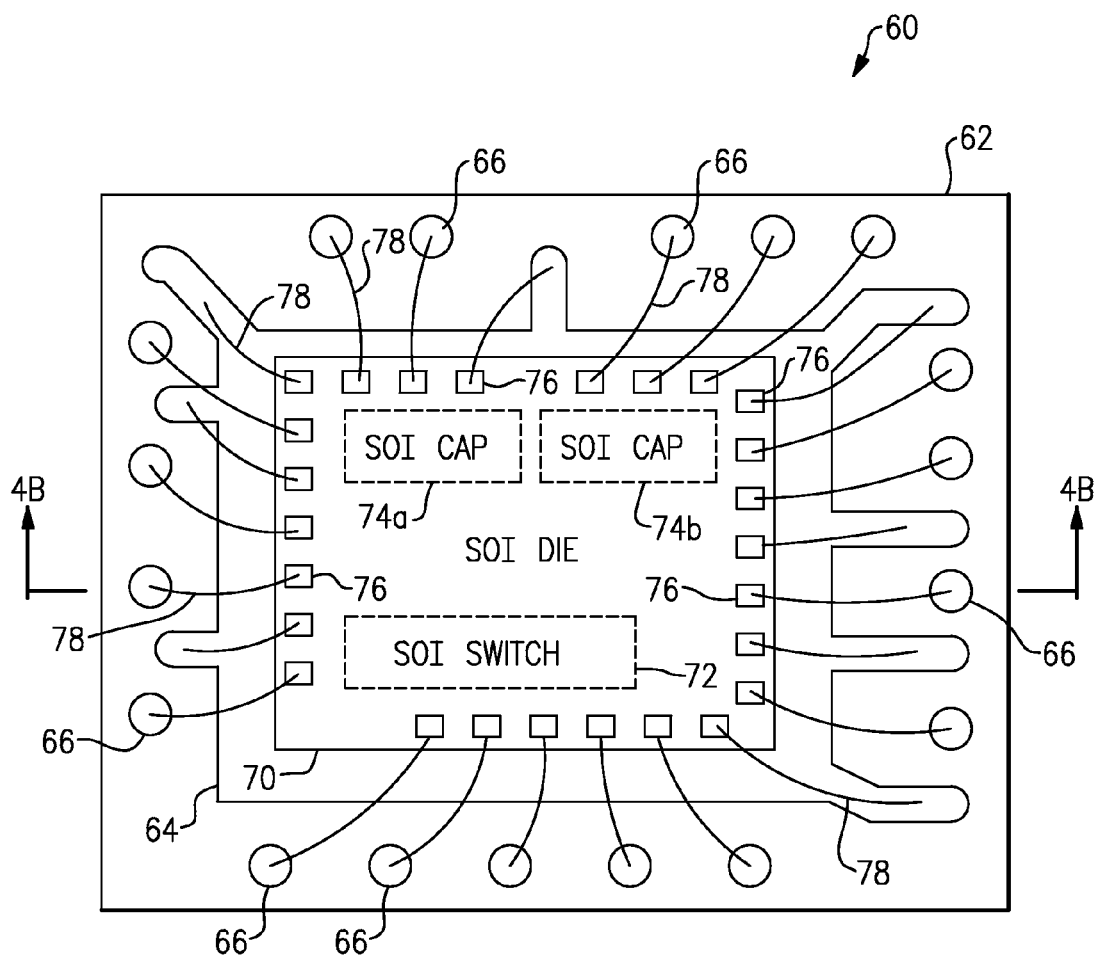
FIG. 4A is a schematic top plan view of an antenna switch module according to one embodiment.

FIG. 4A is a schematic top plan view of an antenna switch module 60 according to one embodiment. The antenna switch module 60 includes a package substrate 62, a silicon on insulator (SOI) die 70, and bond wires 78.

The package substrate 62 includes a die attach paddle or pad 64 and bond pads 66. The SOI die 70 has been attached or mounted to the die attach pad 64 of the package substrate 62. Although not illustrated in FIG. 4A, the package substrate 62 can include a plurality of conductive and non-conductive layers laminated together, and the die attach pad 64 and the bond pads 66 can be formed from a conductive layer disposed on the surface of the package substrate used to attach the SOI die 70.

The SOI die 70 includes an SOI switch 72, a first SOI capacitor 74a, a second SOI capacitor 74b, and pads 76. The SOI switch 72 can be, for example, a single pole multi-throw switch, such as a SP9T switch. In certain implementations, the SOI switch 72 can include a plurality of switches or switch elements configured to collective operate as a multi-throw switch.

As illustrated in FIG. 4A, bond wires 78 can be used for electrically connecting the pads 76 of the SOI die 70 to bond pads 66 disposed on the package substrate 62. The bond wires 78 can provide power, ground, and/or signal connections between the SOI die 70 and the package substrate 62. Although the antenna switch module 60 is illustrated as using bond wires 78 to establish electrical connections between the SOI die 70 and the package substrate 62, the SOI die 70 can be electrically connected in other ways. For example, as will be described in detail below with reference to FIGS. 7A-7B, the SOI die 70 can be used in a flip-chip configuration. Accordingly, the bond wires 78 need not be included in some implementations.

The first and second SOI capacitors 74a, 74b can be capacitors formed on the SOI die 70, such as metal-insulator-metal (MIM) capacitors and/or metal-oxide-metal (MOM) capacitors. In one embodiment, the first and second SOI capacitors 74a, 74b each have a capacitance selected to be in the range of about 0.8 pF to about 2.7 pF. For example, the SOI capacitors can have a capacitance of about 0.8 pF for DCS/PCS high band and about 2.65 pF for GSM/EDGE low band. The first and second SOI capacitors 74a, 74b can occupy any suitable amount of die area, such as between about 29,925 square um to about 33,972 square um of die area, for example, about 32,000 square um of die area.

As will be described in detail below with reference to FIGS. 4B-4C, the antenna switch module 60 includes integrated filters formed from the first and second SOI capacitors 74a, 74b and from inductors (not illustrated in FIG. 4A) disposed in the package substrate 62. By including integrated filters in the antenna switch module 60, RF signal quality can be improved by reducing or removing harmonic signal components from RF signals traveling through the antenna switch module 60. Additionally, forming integrated filters from capacitors disposed on an SOI die 70 and from inductors disposed in the package substrate 62 can reduce the form factor of the antenna switch module 60 by using three-dimensional (3D) integrated filter structures. For example, the illustrated antenna switch module 60 can have a reduced size relative to a scheme in which spiral inductors and surface mount capacitors are disposed side by side on a surface of the package substrate adjacent a switch die.

Figure 4B:
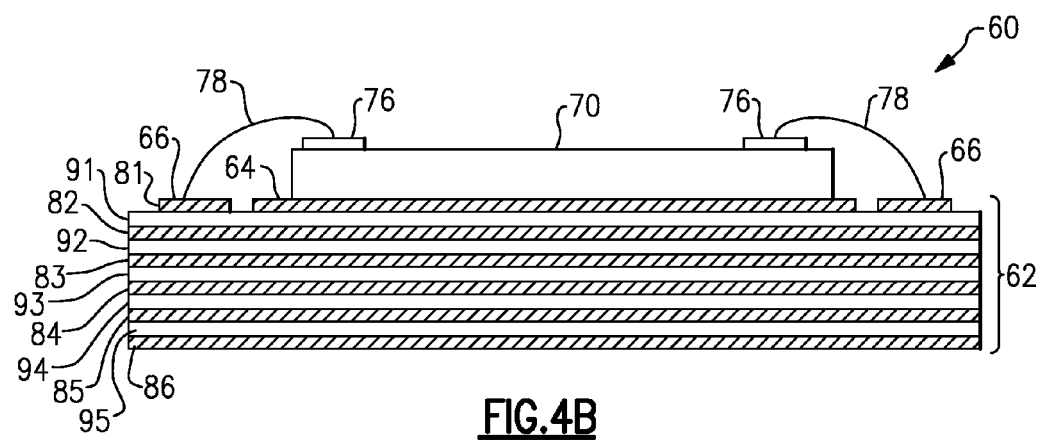
FIG. 4B is a cross section of the antenna switch module of FIG. 4A taken along the lines 4B-4B.

FIG. 4B is a cross section of the antenna switch module 60 of FIG. 4A taken along the lines 4B-4B. The antenna switch module 60 includes the package substrate 62, the SOI die 70, and the bond wires 78. The illustrated package substrate 62 is a multi-layer substrate including first to sixth conductive layers 81-86 and first to fifth non-conductive layers 91-95. FIG. 4C is a schematic top plan view of one example of the third conductive layer 83 of the package substrate 62 of FIGS. 4A-4B. The third conductive layer 83 includes a first spiral inductor 101, a second spiral inductor 102 and first to eleventh vias 104a-104k.

The package substrate 62 can include one or more inductors that can be used with SOI capacitors to form integrated filters of the antenna switch module 60. For example, the third conductive layer 83 includes the first and second spiral inductors 101, 102, which can be electrically connected to the first and second capacitors 74a, 74b (see FIG. 4A) of the SOI die 70 to form a high band and a low band filter, respectively. Accordingly, in certain implementations described herein, an antenna switch module is provided with at least one integrated filter that includes a capacitor disposed on an SOI die and an inductor formed from a conductive layer of a package substrate.

As shown in FIG. 4B, the conductive layers 81-86 can be configured to alternate with the non-conductive layers 91-95. For example, the first non-conductive layer 91 is disposed between the first and second conductive layers 81, 82, the second non-conductive layer 92 is disposed between the second and third conductive layers 82, 83, the third non-conductive layer 93 is disposed between the third and fourth conductive layers 83, 84, the fourth non-conductive layer 94 is disposed between the fourth and fifth conductive layers 84, 85, and the fifth non-conductive layer 95 is disposed between the fifth and sixth conductive layers 85, 86. Although the illustrated package substrate 62 includes six conductive layers and five non-conductive layers, more or fewer conductive and/or non-conductive layers can be provided. Additionally, although the package substrate 62 is shown as including conductive layers on the major surfaces of the package substrate 62, non-conductive layers can be included instead on one or more of the major surfaces of the package substrate 62.

The first to sixth conductive layers 81-86 can each be been patterned to form traces. For example, the first conductive layer 81 has been patterned to form the bond pads 66 and the die attach pad 64, which has been used to attach the SOI die 70. Additionally, the third conductive layer 83 has been patterned to form the first and second spiral inductors 101, 102, which can be formed from trace of the third conductive layer 83. Although the first and second spiral inductors 101, 102 are illustrated as being formed from the third conductive layer 83 of the package substrate 62, the first and second spiral inductors 101, 102 can be formed from any suitable layer of the package substrate 62, including, for example, any conductive layer of the package substrate disposed beneath the layer used to attach the SOI die 70. In some implementations, the first and second spiral inductors 101, 102 can be formed from trace of more than one conductive layer of the package substrate 62. For example, in one embodiment, the first and second inductors 101, 102 are each formed from spiral inductor structures disposed on the third and fourth conductive layers 83, 84.

Vias can be formed between conductive layers to allow electrical connections to be made within the package substrate 62. For example, openings or holes can be provided in any of the non-conductive layers 91-95 of the package substrate 62 and the holes can be filled with a conductor to form vias in the package substrate 62 for electrically connecting adjacent conductive layers. Accordingly, an electrical circuit can be formed by selecting the pattern of the conductive layers 81-86 and by selecting the location of the vias. The package substrate 62 can be any suitable multi-layer substrate, such as a multi-chip-module (MCM) substrate including alternating conductive and nonconductive layers. In one implementation, the conductive layers comprise copper and the nonconductive layers comprise a prepreg material. Although a particular configuration of vias is illustrated in FIG. 4C, more or fewer vias can be included. For example, additional vias associated with ground or power connections can be provided.

The first and second spiral inductors 101, 102 can be electrically connected to the first and second capacitors 74a, 74b

(see FIG. 4A) of the SOI die 70 to form integrated filters. For example, the first and second spiral inductors 101, 102 can be electrically connected to the first and second capacitors 74a, 74b, respectively, by using via structures in the package substrate 62 and by using the bond wires 78. In one implementation, the first inductor 101 has an inductance in the range of about 6 nH to about 7 nH, for example, about 6.5 nH, and the second inductor 102 has an inductance in the range of about 2.5 nH to about 3 nH, for example, about 2.8 nH. Persons having ordinary skill in the art will appreciate that the first and second spiral inductors 101, 102 illustrate one of many examples of spiral inductor structures suitable for use with the antenna switch module 60.

To aid in electrically isolating the first and second inductors 101, 102 from each other, a column of vias can be provided between the first and second inductors 101, 102. For example, as shown in FIG. 4C, the first to seventh vias 104a-104g have been provided between the first and second inductors 101, 102 to help prevent magnetic and/or electric fields of the inductors from interfering with one another. In certain implementations, vias can be placed between each conductive layer such that each of the vias in the column extends from a first major surface of the package substrate to a second major surface of the package substrate. Although seven vias are illustrated as being used to electrically isolate the first and second inductors 101, 102, more or fewer vias can be used. For example, between about 6 vias and about 9 vias can be disposed in a column between the first and second inductors 101, 102. However, more or fewer vias can be used in certain configurations. In one implementation, adjacent vias in the column of vias are separated by a distance of less than about 230 um. Various examples of vias structures suitable for use in electrically isolating the first and second inductors 101, 102 will be described in further detail below with reference to FIGS. 8A-8C.

Figure 4C:
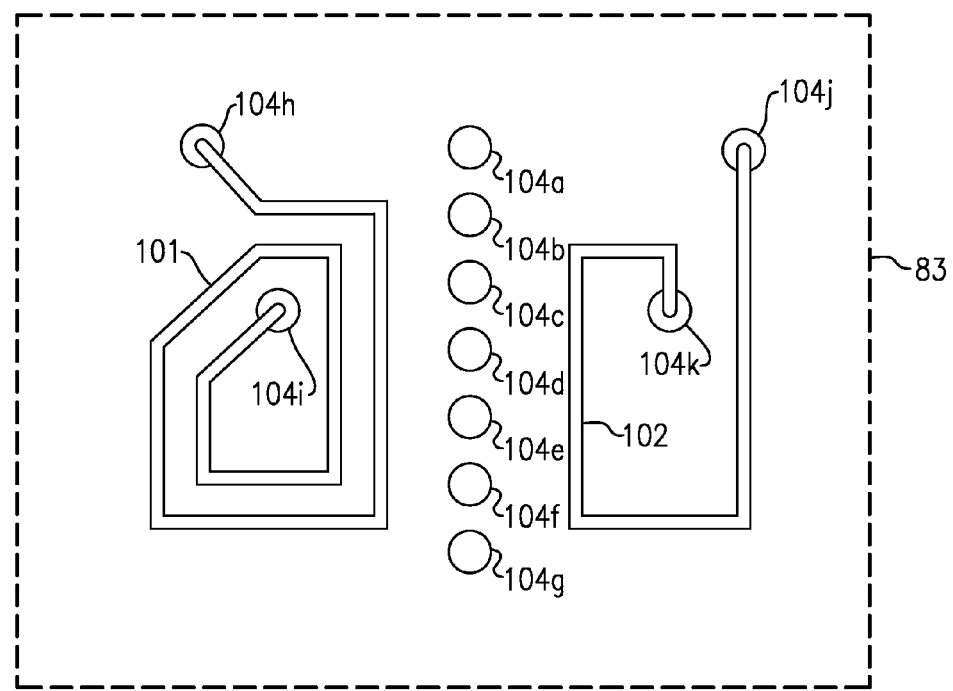
FIG. 4C is a schematic top plan view of one example of a conductive layer for a package substrate of the antenna switch module of FIGS. 4A-4B.

Although the antenna switch module 60 of FIGS. 4A-4C is illustrated and described as including two integrated filters, the antenna switch module 60 can be configured to include more or fewer integrated filters.

Figure 5A:
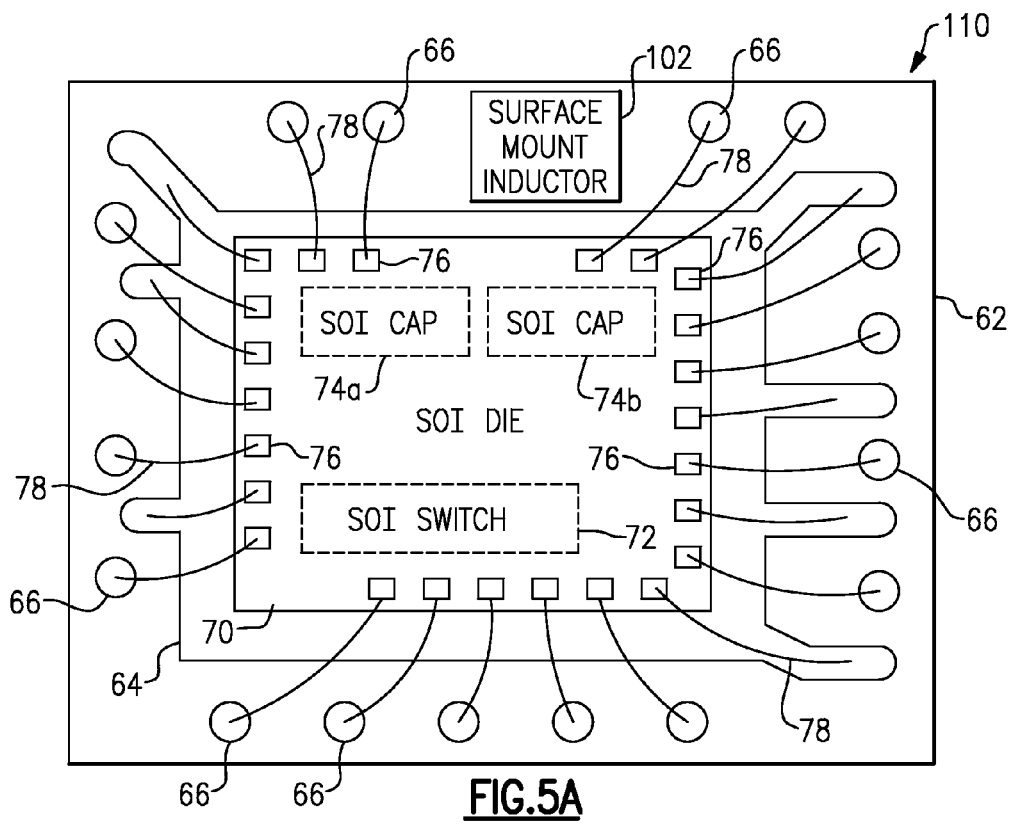
FIG. 5A is a schematic top plan view of an antenna switch module according to another embodiment.

FIG. 5A is a schematic top plan view of an antenna switch module 110 according to another embodiment. The antenna switch module 110 includes the package substrate 62, the SOI die 70, the bond wires 78, and a surface mount inductor 102. The package substrate 62 includes the die attach pad 64 and the bond pads 66, and the SOI die 70 includes the SOI switch 72, the first capacitor 74a, the second capacitor 74b, and the pads 76. The SOI die 70 has been mounted or attached to the die attach pad 64, and the bond wires 78 have been used to attach the pads 76 of the SOI die 70 to the bond pads 66. The surface mount inductor 102 is mounted or attached to the package substrate 62 adjacent the SOI die 70. The surface mount inductor 102 is electrically connected to the second capacitor 74b of the SOI die 70.

Figure 5B:
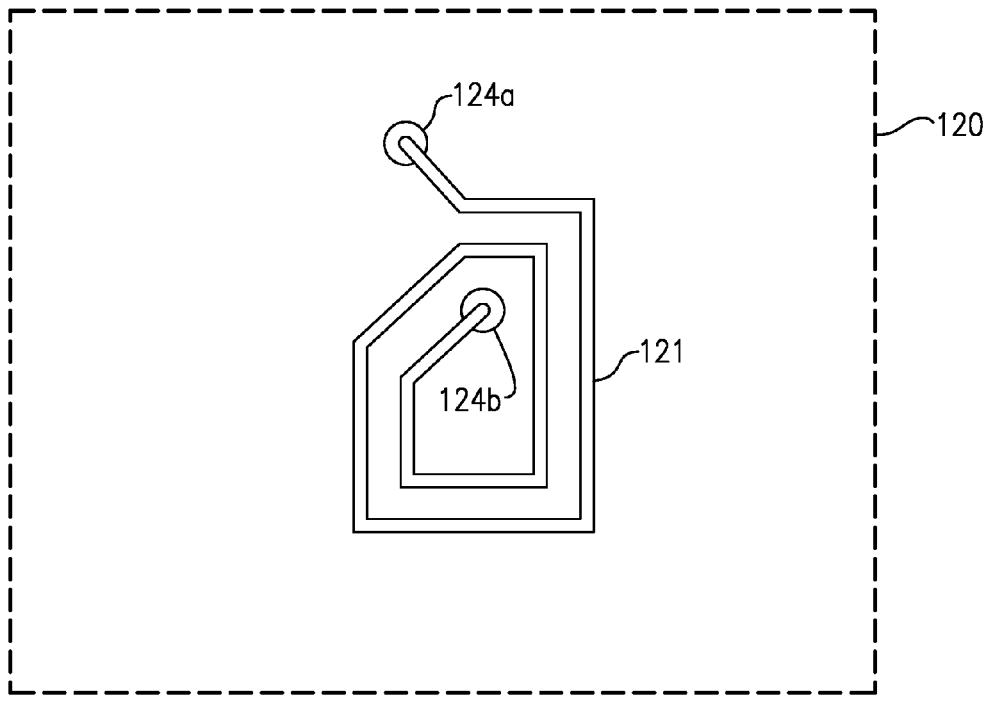
FIG. 5B is a schematic top plan view of one example of a conductive layer for a package substrate of the antenna switch module of FIG. 5A.

As was described earlier with respect to FIG. 4B, the package substrate 62 can be a multi-layer substrate including a plurality of conductive and non-conductive layers. FIG. 5B is a schematic top plan view of one example of a conductive layer 120 for the package substrate 62 of FIG. 5A. The conductive layer 120 includes a spiral inductor 121 and first and second vias 124a, 124b, which can aid in electrically connecting the spiral inductor 121 to the first capacitor 74a of the SOI die 70.

The antenna switch module 110 of FIG. 5A is similar to the antenna switch module 60 of FIGS. 4A-4B, except that the antenna switch module 110 includes integrated filters configured in a different arrangement. For example, the antenna switch module 110 includes a first integrated filter formed using the first SOI capacitor 74a and the spiral inductor 121 of the package substrate 62. Additionally, the antenna switch module 110 further includes a second integrated filter formed using the second SOI capacitor 74b and the surface mount inductor 102. In one embodiment, the first integrated filter is a high band filter and the second integrated filter is a low band filter.

In certain implementations described herein, an antenna switch module can include integrated filters formed from SOI capacitors and surface mount inductors and/or formed from SOI capacitors and spiral inductors of a package substrate. Using both surface mount inductors and spiral inductors formed from package substrate trace can aid in improving isolation between filters. Additionally, using both surface mount inductors and spiral inductors in integrated filter structures can increase routing resources in the package substrate, thereby allowing traces and vias to be used for other purposes, such as increasing a robustness of a ground supply provided to the SOI die through the package substrate.

Figure 6:
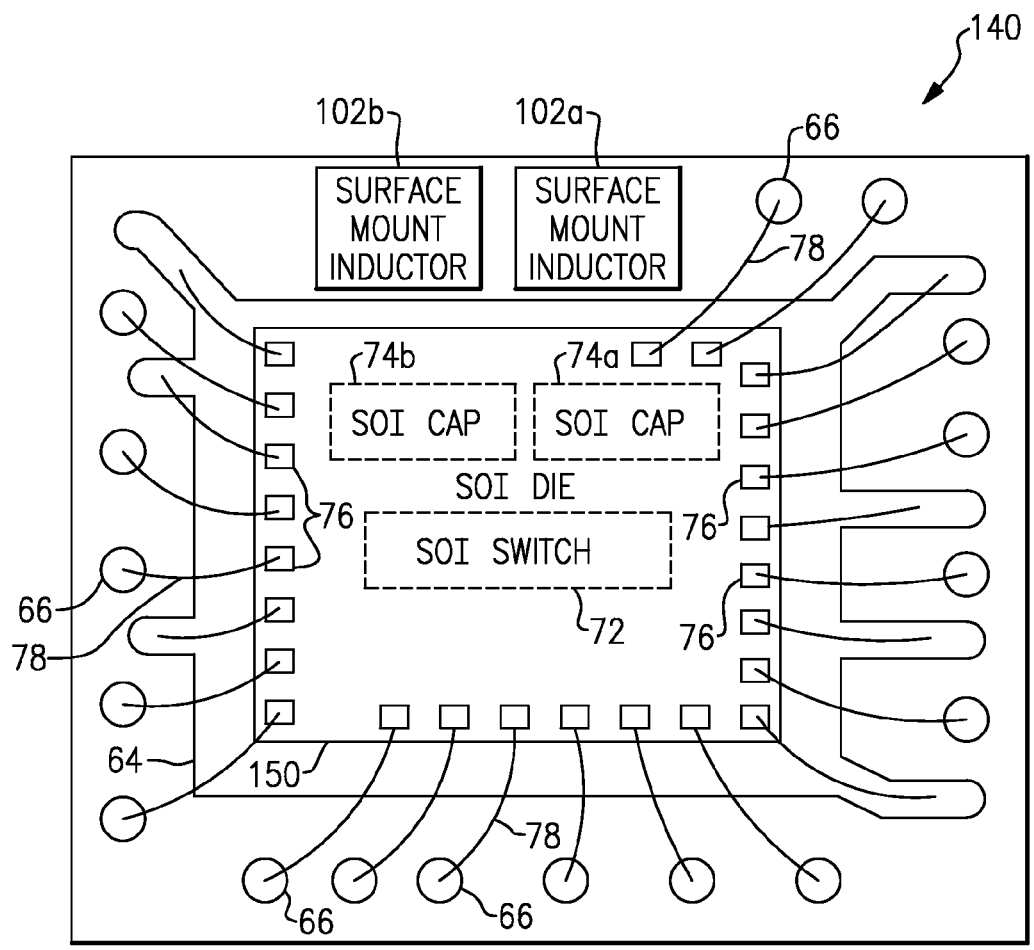
FIG. 6 is a schematic top plan view of an antenna switch module according to another embodiment.

FIG. 6 is a schematic top plan view of an antenna switch module 140 according to another embodiment. The antenna switch module 140 includes the package substrate 62, an SOI die 150, the bond wires 78, and first and second surface mount inductors 102a, 102b. The package substrate 62 includes the die attach pad 64 and the bond pads 66, and the SOI die 150 includes the SOI switch 72, the first capacitor 74a, the second capacitor 74b, and the pads 76. The SOI die 150 has been mounted or attached to the die attach pad 64, and the bond wires 78 have been used to attach the pads 76 of the SOI die 150 to the bond pads 66. The first and second surface mount inductors 102a, 102b are mounted or attached to the package substrate 62 adjacent the SOI die 150, and the first and second surface mount inductors 102a, 102b are electrically connected to the first and second capacitors 74a, 74b, respectively.

The antenna switch module 140 of FIG. 6 is similar to the antenna switch module 60 of FIGS. 4A-4C, except that the antenna switch module 140 includes integrated filters configured in a different arrangement. For example, the antenna switch module 140 includes a first integrated filter formed using the first SOI capacitor 74a and the first surface mount inductor 102a and a second integrated filter formed using the second SOI capacitor 74b and the second surface mount inductor 102b. In certain implementations described herein, an antenna switch module can include integrated filters formed from SOI capacitors and surface mount inductors. Additional details of the antenna switch module 140 can be similar to those of the antenna switch module 60 described earlier.

Figure 7A:
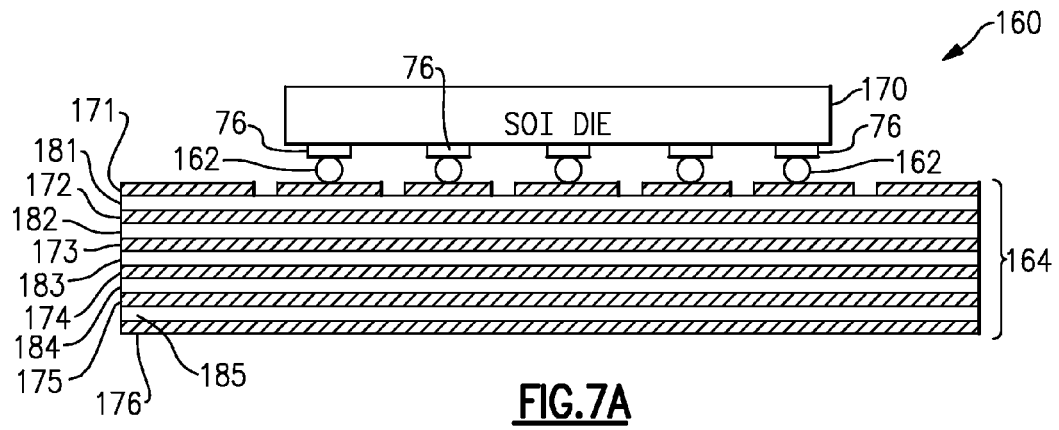
FIG. 7A is a cross section of an antenna switch module according to another embodiment.
Figure 7B:
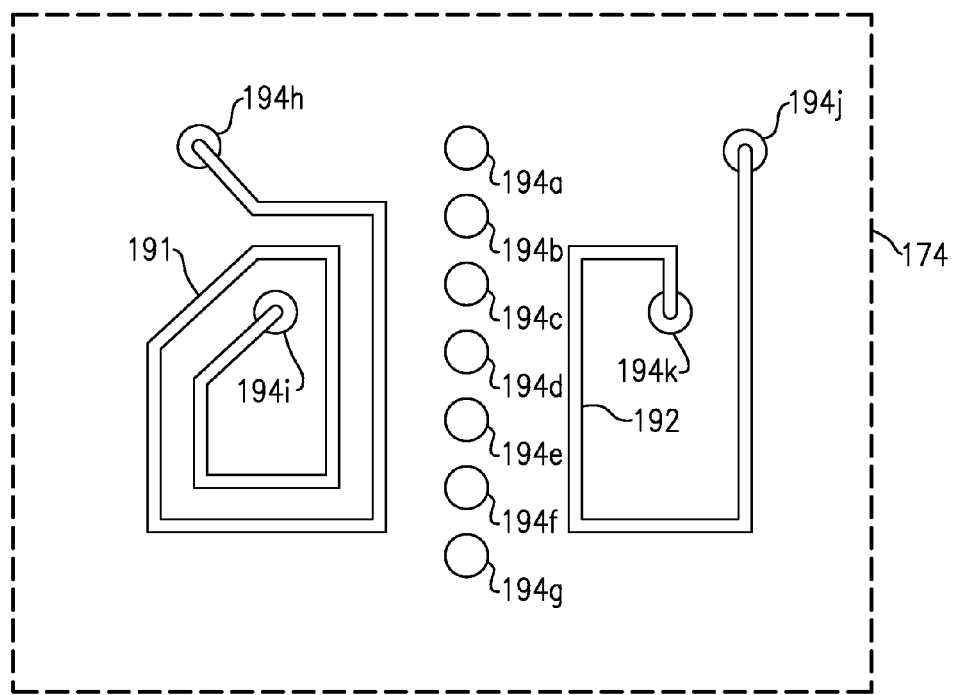
FIG. 7B is a schematic top plan view of one example of a conductive layer for a package substrate of the antenna switch module of FIG. 7A.

FIG. 7A is a cross section of an antenna switch module 160 according to another embodiment. The antenna switch module 160 includes a package substrate 164, a SOI die 170 and solder bumps or balls 162. The package substrate 164 includes first to sixth conductive layers 171-176 and first to fifth non-conductive layers 181-185. FIG. 7B is a schematic top plan view of one example of the fourth conductive layer 174 of the package substrate 164 of the antenna switch module 160 of FIG. 7A. The fourth conductive layer 174 includes a first spiral inductor 191, a second spiral inductor 192 and first to eleventh vias 194a-194k. The first to seventh vias 194a-194g have been provided as a column of vias between the first and second spiral inductors 191, 192 in a manner similar to that described earlier with respect to FIG. 4C.

The antenna switch module 160 of FIG. 7A is similar to the antenna switch module 60 of FIGS. 4A-4B, except that the antenna switch module 160 is implemented using a flip-chip configuration. For example, rather than using wire bonds to electrically connect the SOI die 170 to the package substrate 164, the SOI die 170 of FIG. 7A has been flipped upside down and attached to the package substrate 164 using solder bumps 162. The SOI die 170 can include first and second SOI capacitors, which can be electrically connected to the first and second spiral inductors 191, 192, respectively, to form first and second integrated filters of the antenna switch module 160. Accordingly, in certain implementations described herein, antenna switch modules are provided using an SOI die in a flip-chip arrangement.

Persons having ordinary skill in the art will appreciate that the first and second spiral inductors 191, 192 illustrate one of many examples of spiral inductor structures suitable for use with the antenna switch module 160. Additionally, the first and/or second spiral inductors 191, 192 can be formed on any suitable conductive layer or layers of the package substrate 164, and thus need not be formed from the fourth conductive layer 174. Furthermore, in certain configurations, the antenna switch module 160 can be modified such that the spiral inductors 191, 192 are omitted in favor of using surface mount inductors or such that a mix of spiral inductors and surface mount inductors are used to form integrated filters. Additional details of the antenna switch module 160 can be similar to those described earlier with respect to the antenna switch modules of FIGS. 4A-6.

Figure 8A:
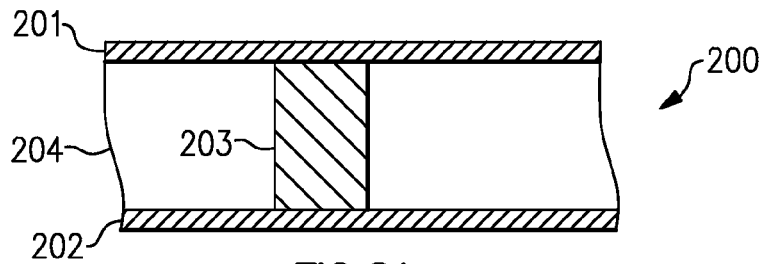
FIGS. 8A-8C are cross sections of various examples of via structures for antenna switch modules.
Figure 8B:
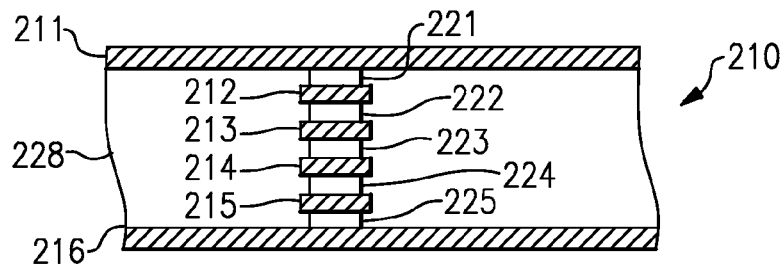
Figure 8C:
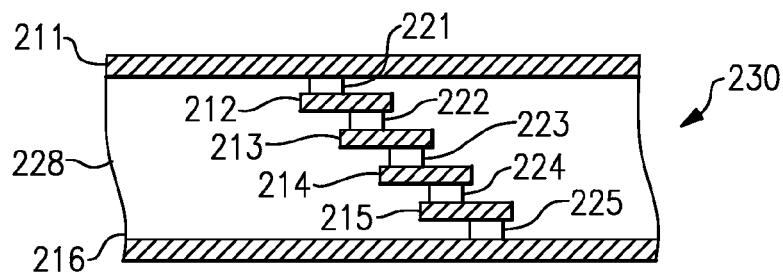

FIGS. 8A-8C are cross sections of various examples of via structures for antenna switch modules.

FIG. 8A is a cross section of one example of a portion of a package substrate 200 for an antenna switch module. The package substrate 200 includes a via structure 203 formed through a non-conductive region or structure 204 of the package substrate 200. The via structure 203 electrically connects a first conductive layer 201 to a second conductive layer 202, which are disposed on opposing major surfaces of the package substrate 200. Accordingly, the via structure 203 is a through-substrate via. The via structure 203 can be used in the column of vias 104a-104g of FIG. 4C and/or in the column of vias 194a-194g of FIG. 7B.

FIG. 8B is a cross section of another example of a portion of a package substrate 210 for an antenna switch module. The package substrate 210 includes first to sixth conductive layers 211-216, a non-conductive region or structure 228 and first to fifth vias 221-225. The first to fifth vias 221-225 are aligned with one another and electrically connect the first conductive layer 211 to the sixth conductive layer 216, which are disposed on opposing major surfaces of the package substrate 210. In some implementations, one or more of the vias in the column of vias 104a-104g of FIG. 4C and/or in the column of vias 194a-194g of FIG. 7B can have a structure similar to that illustrated in FIG. 8B.

FIG. 8C is a cross section of another example of a portion of a package substrate 230 for an antenna switch module. The package substrate 230 includes first to sixth conductive layers 211-216, a non-conductive region 228 and first to fifth vias 221-225. The package substrate 230 is similar to the package substrate 210 of FIG. 8B, except that the first to fifth vias 221-225 are staggered rather than aligned. In some implementations, one or more of the vias in the column of vias 104a-104g of FIG. 4C and/or in the column of vias 194a-194g of FIG. 7B can have a structure similar to that illustrated in FIG. 8C.

Figure 9:
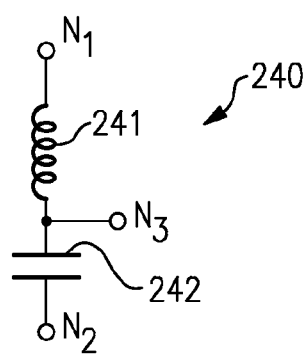
FIG. 9 is a circuit diagram illustrating one example of a filter.

FIG. 9 is a circuit diagram illustrating one example of a filter 240. The filter 240 includes an inductor 241 and a capacitor 242. The inductor 241 includes a first end electrically connected to a node $N_1$ and a second end electrically connected to a first end of the capacitor 242 at a node $N_3$. The capacitor 242 further includes a second end electrically connected to a node $N_2$.

In some implementations described herein, antenna switch modules can include an integrated filter electrically connected in the configuration shown in FIG. 9. For example, the filter 240 can be configured to operate as a low pass filter, and the node $N_1$ can be configured to receive a RF signal, the node $N_2$ can be electrically connected to ground, and the node $N_3$ can be configured to generate an output of the filter 240. In certain implementations, an SOI capacitor operate as the capacitor 242 and a surface mount inductor and/or a spiral inductor formed from trace in a package substrate can operate as the inductor 241. Although the filter 240 illustrates one possible implementation of the integrated filters described herein, other configurations are possible.

Applications

Some of the embodiments described above have provided examples in connection with mobile phones. However, the principles and advantages of the embodiments can be used for any other systems or apparatus that have needs for antenna switch modules.

Such antenna switch modules can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of making an antenna switch module, the method comprising:
   providing a package substrate implemented to receive one or more electrical components;
   attaching a silicon on insulator (SOI) die to the package substrate, the SOI die including a first capacitor and a switch coupled to a plurality of radio frequency (RF) signal paths; and
   providing a first integrated filter that filters an RF signal received on a first RF signal path of the plurality of RF signal paths, the first integrated filter including the first capacitor of the SOI die and a first inductor.

2. The method of claim 1 wherein the first inductor is a surface mount component, the method further comprising attaching the first inductor to the package substrate.

3. The method of claim 1 further comprising implementing the first inductor at least partly from a first conductive layer of a plurality of conductive layers of the package substrate, the first conductive layer disposed beneath a layer of the package substrate used to attach the SOI die.

4. The method of claim 3 further comprising implementing the first inductor from trace of two or more of the plurality of conductive layers.

5. The method of claim 3 further comprising implementing the inductor to have an inductance ranging between about 2.5 nH and about 7 nH.

6. The method of claim 1 further comprising providing a second integrated filter that filters an RF signal received on a second RF signal path of the plurality of RF signal paths, the second integrated filter including a second capacitor of the SOI die and a second inductor.

7. The method of claim 6 further comprising implementing the first and second inductors at least partly from a first conductive layer of a plurality of conductive layers of the package substrate, the first conductive layer disposed beneath a layer of the package substrate used to attach the SOI die.

8. The method of claim 7 further comprising electrically isolating the first and second inductors using a column of vias of the package substrate.

9. The method of claim 8 further comprising implementing the column of vias of the package substrate to be aligned with one another.

10. The method of claim 8 further comprising implementing the column of vias of the package substrate to be staggered with respect to one another.

11. The method of claim 6 wherein the first inductor is a surface mount component, the method further comprising attaching the first inductor to the package substrate and implementing the second inductor at least partly from a first conductive layer of a plurality of conductive layers of the package substrate, the first conductive layer disposed beneath a layer of the package substrate used to attach the SOI die.

12. The method of claim 6 wherein the first inductor is a first surface mount component and the second inductor is a second surface mount component, the method further comprising attaching the first and second inductors to the package substrate.

13. The method of claim 1 wherein attaching the SOI die to the package substrate includes electrically connecting the SOI die to the package substrate using bond wires.

14. The method of claim 1 wherein attaching the SOI die to the package substrate includes electrically connecting the SOI die to the package substrate using solder bumps.

15. A method of switching in an antenna switch module, the method comprising:
   receiving a plurality of radio frequency (RF) signals at a multi-throw switch over a plurality of RF signal paths, the multi-throw switch being disposed on a silicon on insulator (SOI) die attached to a package substrate;
   filtering a first RF signal of the plurality of RF signals to generate a first filtered signal using a first integrated filter, the first integrated filter including a first capacitor of the SOI die and a first inductor associated with the package substrate; and
   providing the filtered signal to an antenna using the multi-throw switch.

16. The method of claim 15 further comprising receiving the first RF signal from an output of a power amplifier.

17. The method of claim 15 further comprising filtering a second RF signal of the plurality of RF signals to generate a second filtered signal using a second integrated filter, the second integrated filter including a second capacitor of the SOI die and a second inductor associated with the package substrate.

18. The method of claim 17 wherein the first inductor and the second inductor are implemented using a plurality of conductive layers of the package substrate, the method further comprising electrically isolating the first and second inductors using a column of vias of the package substrate.

19. The method of claim 17 wherein filtering the first RF signal includes filtering a high band radio frequency signal in an 1800 MHz band or a 1900 MHz band.

20. The method of claim 19 wherein filtering the first RF signal includes filtering a low band radio frequency signal in an 800 MHz band or a 900 MHz band.

* * * * *

UNITED STATES PATENT AND TRADEMARK OFFICE
CERTIFICATE OF CORRECTION

PATENT NO. : 8,987,061 B2
APPLICATION NO. : 14/309670
DATED : March 24, 2015
INVENTOR(S) : Jong-Hoon Lee et al.

Page 1 of 1

It is certified that error appears in the above-identified patent and that said Letters Patent is hereby corrected as shown below:

On The Title Page (item 71, Applicant) at line 1, Change "Wobum," to --Woburn,--.

On The Title Page (item 73, Assignee) at line 1, Change "Soultions," to --Solutions,--.

Signed and Sealed this
Fifteenth Day of December, 2015

Michelle K. Lee
*Director of the United States Patent and Trademark Office*